Figure 3:
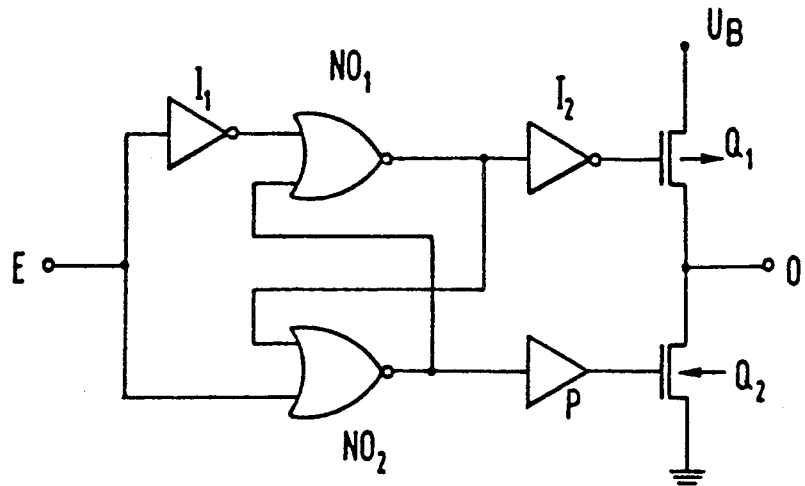

United States Patent [19]
Reichmeyer et al.

[11] Patent Number: 5,126,588
[45] Date of Patent: Jun. 30, 1992

[54] DIGITAL PUSH-PULL DRIVER CIRCUIT

[75] Inventors: Hans Reichmeyer; Josef Stockinger, both of Munich, Fed. Rep. of Germany

[73] Assignee: SGS-Thomson Microelectronics GmbH, Grafing, Fed. Rep. of Germany

[21] Appl. No.: 464,726

[22] Filed: Jan. 16, 1990

Related U.S. Application Data

[63] Continuation of Ser. No. 163,653, Mar. 3, 1988, abandoned.

Foreign Application Priority Data

Mar. 16, 1987 [DE] Fed. Rep. of Germany ....... 3708499

[51] Int. Cl.$^5$ .............................................. H03K 5/12
[52] U.S. Cl. .................................. 307/270; 307/263; 307/268; 307/579
[58] Field of Search ............... 307/262, 263, 268, 270, 307/300, 473, 571, 577, 579, 585, 443

[56] References Cited

U.S. PATENT DOCUMENTS

| | | |
|---|---|---|
| 3,845,328 | 10/1974 | Hollingsworth . |
| 3,906,255 | 9/1975 | Mensch, Jr. . |
| 3,961,269 | 11/1976 | Alvarez, Jr. . |
| 4,164,842 | 7/1979 | Ebihara . |
| 4,540,904 | 4/1985 | Ennis . |
| 4,622,482 | 11/1986 | Ganger .................. 307/585 |
| 4,725,747 | 2/1988 | Stein et al. ............ 307/263 |
| 4,843,595 | 6/1989 | Suzuki .................... 307/530 |

FOREIGN PATENT DOCUMENTS

| | | |
|---|---|---|
| A10053014 | 6/1981 | European Pat. Off. . |
| 2737506 | 3/1978 | Fed. Rep. of Germany . |
| 2737506B | 4/1978 | Fed. Rep. of Germany . |
| 2737544 | 9/1979 | Fed. Rep. of Germany . |
| 2904674B1 | 4/1980 | Fed. Rep. of Germany . |
| 0024766 | 3/1978 | Japan .................. 307/585 |
| 58-142626 | 8/1983 | Japan . |
| 59-201524 | 11/1984 | Japan . |
| 60-165117(1) | 1/1985 | Japan . |
| 60-142620(1) | 6/1985 | Japan . |
| 0224325 | 11/1985 | Japan .................. 307/473 |
| 61-126818(1) | 6/1986 | Japan . |
| 0141221 | 6/1986 | Japan .................. 307/571 |
| 0135013 | 6/1987 | Japan .................. 307/571 |
| 0166615 | 7/1987 | Japan .................. 307/571 |
| 2032719 | 12/1979 | United Kingdom . |
| 2119193 | 1/1983 | United Kingdom . |

Primary Examiner—John Zazworsky
Attorney, Agent, or Firm—Dickstein, Shapiro & Morin

[57] ABSTRACT

A digital push-pull driver circuit comprising two output transistors which are alternatingly controlled into the conducting state by a data control circuit and to whose common connection point a load to be driven is connected. One slope steepness reducing, enable-dependent delay circuit each is connected between the control electrode of each of the two output transistors and the data control circuit. The output of each delay circuit is connected to an enable input of the respective other delay circuit. The delay times of the two delay members are at least as long as the width of the steepness-reduced pulse slopes in terms of time.

6 Claims, 3 Drawing Sheets

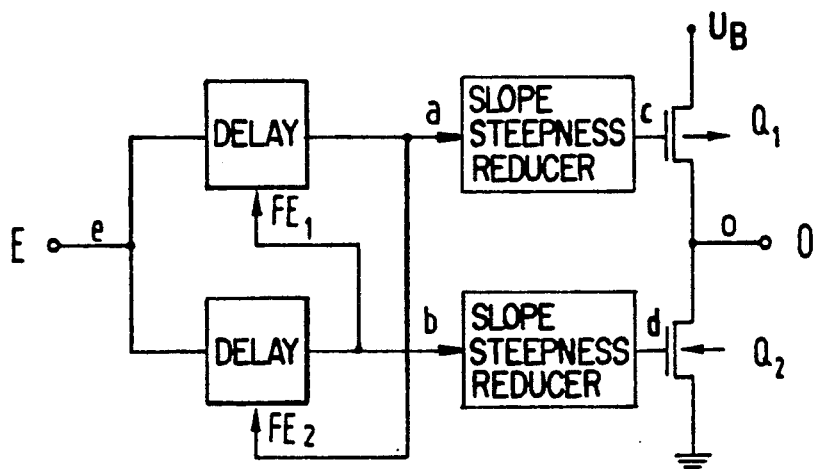
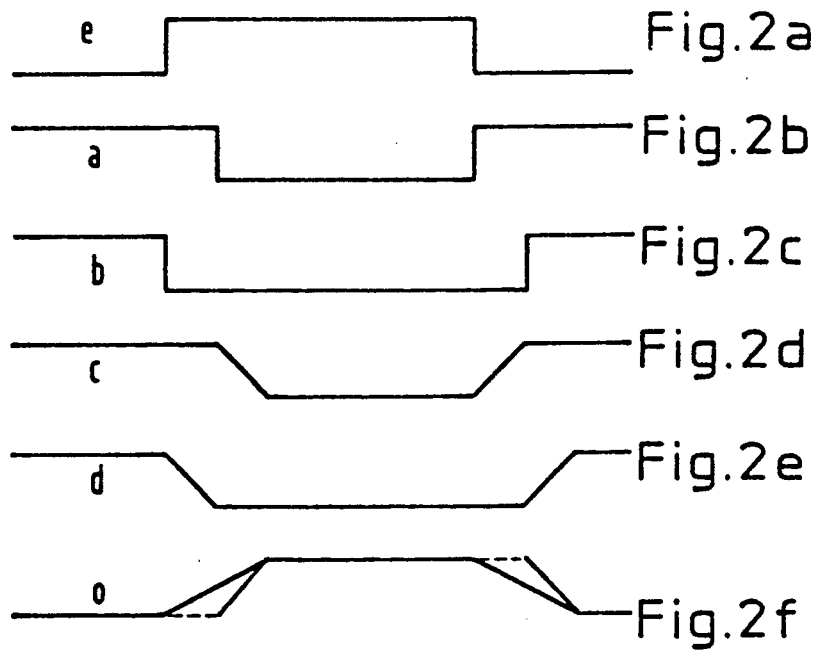

Fig. 5
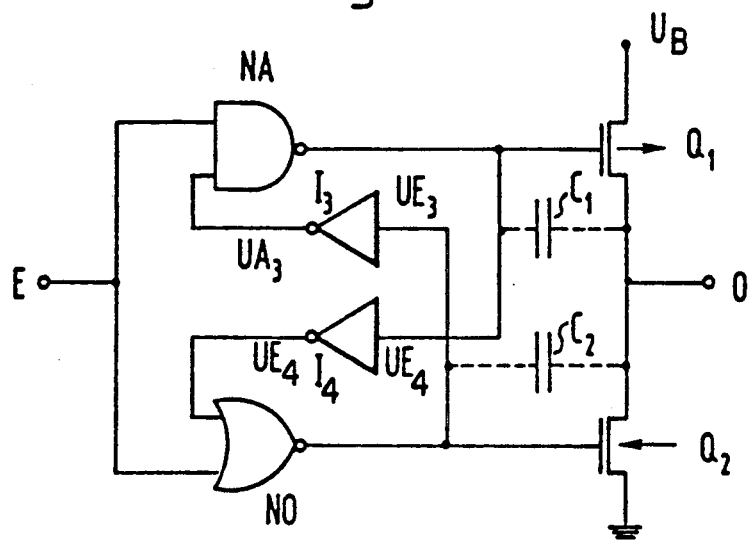
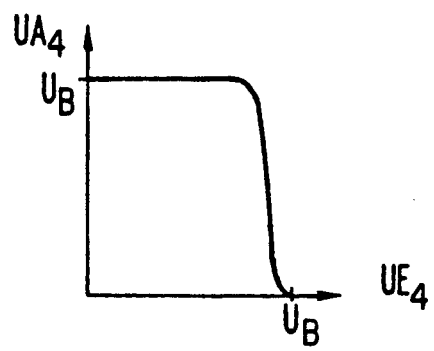
Fig. 6a
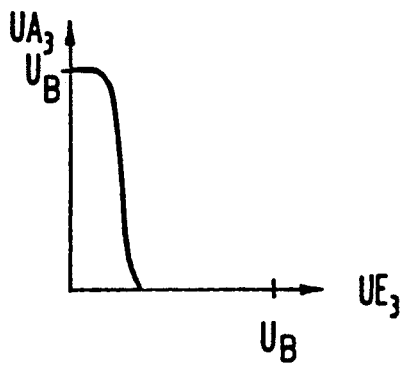
Fig. 6b

DIGITAL PUSH-PULL DRIVER CIRCUIT

This application is a continuation of U.S. Pat. application Ser. No. 07/163,653, filed Mar. 3, 1988, now abandoned.

The invention relates to a digital push-pull driver circuit.

In the endeavor to make microprocessors and microcomputers employing such microprocessors increasingly faster, the edges or slopes of the data pulses have become very steep. In some applications, this leads to disturbances in circuits and apparatus outside of the microcomputer. For instance, such rapid data pulse slopes in the automobile sector lead to disturbances of car radios.

Disturbances occur in particular when CMOS microprocessors are employed. In the push-pull output stages used therein, there are shunt or short circuit currents arising in the transition region between the switching of the one transistor into the conducting state and the blocking of the other transistor, because both transistors then are conducting temporarily. Especially when such shunt currents occur at several outputs at the same time, there may arise considerable short-time current loads of the voltage supply source and, thus, also pulse-shaped disturbance signals.

In case of a known solution for overcoming said problem, a capacitor was inserted between the two poles of the voltage supply source on the one hand so as to smoothen the disturbing supply current peaks, and each output of the microprocessor was on the other hand followed by a filter circuit, either in the form of an RC circuit when the power output available was of less significance, or in the form of an LC circuit. The capacitor inserted between the poles of the supply voltage source must be able to withstand high powers on the one hand and must be suitable for high frequencies on the other hand. This means that relatively expensive component parts and relatively much space are required. To connect each output of the microprocessor to an RC or an LC filter circuit also leads to high costs and a great requirement of space.

These known measures are especially problematic when the microprocessor is part of a thin-film circuit, which is frequently the case.

It is the object of the invention to make available a solution for overcoming the above-described disturbance problems, which involves considerably less expenditure and is considerably less expensive.

In carrying out the above objective of the present invention, there is provided, in one form of the invention, a digital push-pull driver circuit adapted to be used for microprocessor output stages and comprising an input terminal coupled to a data source means and an output terminal coupled to a load; a first and second output transistor, each having two main path electrodes, one of which is coupled to a power supply and the other of which is coupled to the output terminal, and each having a control electrode coupled to the input terminal, for alternatingly controlling the two output transistors into their conducting state; a first and a second slope steepness reducing circuit, the first one of which is coupled between the input terminal and the control electrode of the first output transistor, and the second one of which is coupled between the input terminal and the control electrode of the second output transistor; a first and a second enable-dependent delay circuit, each having an output and an enable control input, the first enable-dependent delay circuit being coupled between the input terminal and the control electrode of the first output transistor and the second enable-dependent delay circuit being coupled between the input terminal and the control electrode of the second output transistor; where the output of each enable-dependent delay circuit is coupled to the enable control input of the respective other enable-dependent delay circuit; and where the delay times of each of the enable-dependent delay circuits are at least as long as the width of the steepness-reduced slopes in terms of time.

The measures according to the invention ensure on the one hand that the signal pulses occurring at the outputs have sufficiently slow slope transitions for preventing HF disturbances affecting other circuits or apparatus, and on the other hand that there will be no common conducting times of the two output transistors of an output stage, thereby preventing the also disturbing supply current pulses and leading to an as a whole lower power loss.

In a particularly preferred embodiment of the invention, one feedback capacitance each is provided between the output of the driver stage and the enable input of each delay circuit, by means of which both the slope or edge steepness reduction and the delay time of each delay circuit are made dependent on the load current of the driver circuit.

The delay circuits may each be formed by a delay-action gate circuit, for instance a NOR element or a NAND element. However, it is also possible to provide in each of the two delay circuits a monostable element (mono-flop), with one of said elements reacting in delaying manner on the ascending pulse slopes and the other one on the descending pulse slopes, with the respective other slope being allowed to pass in undelayed manner.

Moreover, there is the possibility of using in the delay circuits bistable elements (flip-flops) which are controlled by the data pulses on the one hand and by separate clock pulses on the other hand. It must be considered in this respect that the occurrence of the clock signals in terms of time must be such that the delay times generated by the flip-flops are longer than the slope transitions of the slope steepness-reduced pulses.

The delay circuits may be composed either by a series connection of a delay member and a slope steepness reducing member or, as an alternative thereto, it is possible to use for the delay circuits delay members which effect a slope steepness reduction by themselves, for instance transistors of weak design in the gate circuits.

Figure 4:
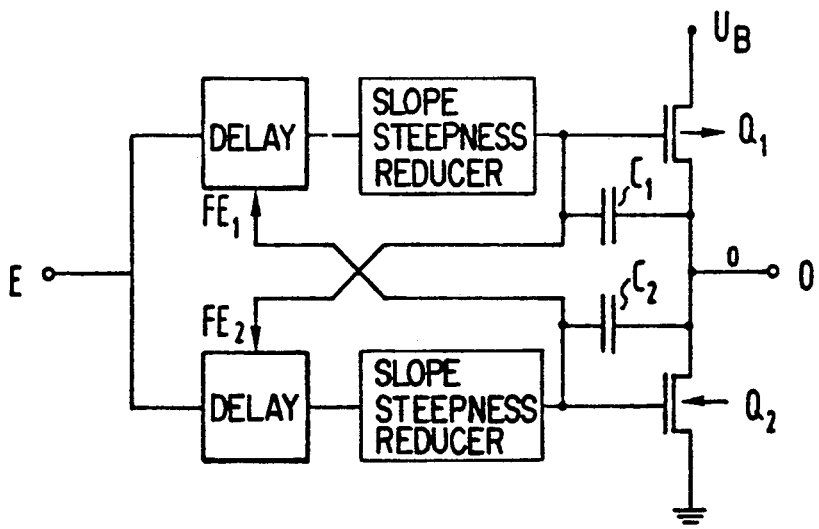

The invention will now be elucidated in more detail on the basis of embodiments. The drawings show:

FIG. 1 a first embodiment of a push-pull driver circuit according to the invention;

FIG. 2(a) to 2(f) voltage patterns at various points of the push-pull driver circuit shown in FIG. 1;

FIG. 3 an example for a circuit realization of the embodiment shown in FIG. 1;

FIG. 4 a second embodiment of the push-pull driver circuit according to the invention;

FIG. 5 a circuit example of a realization of the embodiment shown in FIG. 4; and FIG. 6(a) and 6(b) transition characteristics of two inverters shown in FIG. 5.

The embodiment illustrated in FIG. 1 contains a push-pull driver circuit in CMOS technology, i.e. with two complementary MOS transistors Q1 and Q2. These transistors are arranged in series connection between the two poles of a supply voltage source $U_B$.

Upstream of the gate electrode of the transistor Q1 there is connected a series connection of a delay member V1 and a slope steepness reducing member FV1. Upstream of the gate electrode of the transistor Q2 there is connected a series connection of a delay member V2 and a slope steepness reducing member FV2. The inputs of the two delay members V1 and V2 are connected in common to a data input E. The two delay members V1 and V2 are each enable-dependent, i.e. they allow the signal present at their input to pass only after having been released or enabled through an enable signal at an enable input FE1 and FE2, respectively. The output of the delay member V1 is connected to the enable input FE2, while the output of the delay member V2 is connected to the enable input FE1.

The letters a to e and o designate voltage signals depicted in FIGS. 2(a) to 2(f).

The following is an elucidation of the mode of operation of the embodiment shown in principle in FIG. 1 in the form of a block diagram. In this respect, H means a high signal value and L means a low signal value, which may be assigned for instance the logical values "1" and "0", respectively.

It shall be assumed as an example that the input signal e changes from L to H. As a consequence thereof, the output signal b of V2 changes from H to L. Starting with this signal transition of b, the signal d decreases from H with a bevelled slope until it reaches L. Thus, Q2 is gradually brought from the conducting state into the blocking state.

The transition from H to L of the signal b releases the delay member V1 so that this delay member V1, after a delay time that is longer than the slope transition time of the signal d, changes from the H state into the L state. This edge of the signal a causes the gradual transition of the signal c from the H state to the L state. In corresponding manner, Q1 is thus gradually brought from the blocking into the conducting state.

It can be taken from the signal patterns in FIGS. 2(a) to 2(f) that, due to this measure, each of the two transistors Q1 and Q2 can be brought into the conducting state only when the respective other transistor is blocked completely. Thus, at the output 0 an output signal o occurs which has bevelled slopes according to FIG. 2(f). Due to the fact that the two transistors Q1 and Q2 are never switched on simultaneously, the disturbing shunt or short circuit currents are avoided as well.

FIG. 3 illustrates a circuit realization of the embodiment shown in FIG. 1. The delay members are each formed therein by a NOR element NO1 and NO2, respectively. First inputs of NO1 and NO2 are connected to the data input E, in the case of NO1 via a fist inverter I1 and in the case of NO2 in direct manner. Second inputs of NO1 and NO2 are connected to the output of the respective other NOR element NO2 or NO1, respectively. The outputs of NO1 and NO2 are connected to the gate electrodes of Q1 and Q2 via a second inverter I2 and a buffer P, respectively.

The NOR elements NO1 and NO2 are designed internally in such a manner that their signal paths between the second inputs and the outputs are subject to delay. The second inverter I2 and the buffer P are dimensioned such that they effect a slope or edge steepness reduction. For this purpose, they are composed for instance with transistors of weak dimensions. This means that the maximum output current of I2 and P is of such low dimension that the gate capacitance of Q1 and Q2, respectively, is charged only with the desired steepness-reduced slope.

The delay time of NO1 with respect to its second input must be greater than the slope steepness reduction effected by P. In like manner the delay time of NO2 with respect to its second input must be greater than the slope steepness reduction effected by I2.

A second embodiment of the invention is shown in FIG. 4 in the form of a block diagram. Components corresponding to those of FIG. 1 bear the same reference characters.

Different from the embodiment according to FIG. 1, the embodiment according to FIG. 4 comprises a capacitive feedback between the output 0 and the delay members. For this purpose, a first feedback capacitance C1 is connected between the enable input of the delay member V2 and the output terminal 0, and a second feedback capacitance C2 is connected between the enable input of the delay member V1 and the output terminal 0. The sides of C1 and C2 that are not connected to the output 0 are connected in addition to the gate of Q1 and Q2, respectively.

The feedback capacitors C1 and C2 effect slowing down of the switching-over operations of the transistors Q1 and Q2 and thus slowing down of the level change at the driver output terminal 0.

The delay effected by the feedback capacitors C1 and C2 also has an effect on a correspondingly delayed enable operation of the delay members V2 and V1, respectively.

A circuit realization of the embodiment shown in FIG. 4 is illustrated in FIG. 5. In this driver circuit, the delay member V1 is formed by a NAND element NA, whereas the delay member V2 is formed by a NOR element NO. In this case, too, a first input of the respective delay member is again connected to the data input E, and a second input, which has an internal delay action, is again connected to the output of the respective other delay member. More specifically, the second input of NA is connected to the output of NO via a first inverter I3, and the second input of NO is connected to the output of NA via a second inverter I4. The output of NA is directly connected to the gate of Q1 and via a first feedback capacitor C1 to the output terminal O, whereas the output of NO is directly connected to the gate of Q2 and via a second feedback capacitor C2 to the output O.

The delay of the two delay members may be achieved either by the internal delay of NA and NO, respectively, and/or by a delay of the inverters I3 and I4 that is obtained by a corresponding circuit design. The slope steepness reduction is effected by the dimensioning of NA and NO.

FIGS. 6(a) and 6(b) illustrate the transition behavior of the inverters I4 and I3, respectively, which leads to the desired overall behavior of the circuit as regards the suppression of shunt currents. According to FIG. 6(a), the inverter I4 is to change from the H state to the L state only when its input signal is clearly above half of the supply voltage. In contrast thereto, according to FIG. 6(b) the inverter I3 is to change from its H state to its L state already when its input signal still is clearly below half of the supply voltage.

We claim:

1. A digital push-pull driver circuit adapted to be used for microprocessor output stage, comprising:

an input terminal coupled to a data source means for supplying data pulses, and an output terminal coupled to a load;

a first and a second output transistor each having two main path electrodes one of which is coupled to a power supply means and the other one of which is coupled to said output terminal, and each having a control electrode coupled for alternatingly controlling the said two output transistors into the conducting state;

a first and a second series connection means, the first series connection means coupling the control electrode of the first output transistor to the input terminal and the second connection means coupling the control electrode of the second output transistor to the input terminal;

the first series connection means comprising, in series connection, a first slope steepness reducing means and a first enable-dependent delay circuit and the second series connection means comprising, in series connection, a second slope steepness reducing means and a second enable-dependent delay circuit;

each slope steepness reducing means being adapted to reduce the slope steepness of said data pulses, resulting in a predetermined width of each slope;

each enable-dependent delay circuit having a predetermined delay time and each having an enable control input and an output;

wherein said output of each enable-dependent delay circuit is also coupled to said enable control input of the respective other enable-dependent delay circuit;

and wherein the delay times of each of the enable-dependent delay circuits are at least as long as the width of the steepness-reduced slopes in terms of time.

2. A push-pull driver circuit according to claim 1, wherein the delay circuits are each formed by a delay-action gate circuit having an output a first input connected to the input terminal, and a second input connected to the output of the respective other gate circuit.

3. A digital push-pull driver circuit adapted to be used for microprocessor output stages, comprising:

an output terminal coupled to a data source means for supplying data pulses, and an output terminal coupled to a load;

a first and a second output transistor each having two main path electrodes one of which is coupled to a power supply means and the other one of which is coupled to said output terminal, and each having a control electrode coupled for alternatingly controlling the said two output transistors into the conducting state;

a first and a second series connection means, the first series connection means coupling the control electrode of the first output transistor to the input terminal and the second connection means coupling the control electrode of the second output transistor to the input terminal;

the first series connection means comprising, in series connection, a first slope steepness reducing means and a first enable-dependent delay circuit and the second series connection means comprising, in series connection, a second slope steepness reducing means and a second enable-dependent delay circuit;

each slope steepness reducing means having an output and being adapted to reduce the slope steepness of said data pulses, resulting in a predetermined width of each slope;

each enable-dependent delay circuit having a predetermined delay time and each having an enable control input;

wherein said output of each slope steepness reducing means is also coupled to said enable control input of the enable-dependent delay circuit coupled to the respective other slope steepness reducing means; and wherein the delay times of each of the enable-dependent delay circuits are at least as long as the width of the steepness-reduced slopes in terms of time.

4. A push-pull driver circuit according to claim 3, further including a respective feedback capacitor connected between a common connection point of the two output transistors and the control electrode of each of the first and second, respectively, output transistors.

5. A push-pull driver circuit according to claim 4, wherein the feedback capacitors are formed by the parasitic drain-gate capacitances of the output transistors.

6. A digital push-pull driver circuit adapted to be used for microprocessor output stages, comprising:

an input terminal coupled to a data source means for supplying data pulses, and an output terminal coupled to a load;

a first and a second output transistor each having two main path electrodes one of which is coupled to a power supply means and the other one of which is coupled to said output terminal, and each having a control electrode coupled to said input terminal for alternatingly controlling the said two output transistors into the conducting state;

a first and a second enable-dependent delay circuit each having a predetermined delay time and each having an output and an enable control input, the first enable-dependent delay circuit being coupled between said input terminal and the control electrode of said first output transistor and the second enable-dependent delay circuit being coupled between said input terminal and the control electrode of said second output transistor; and the first enable-dependent delay circuit comprising a first slope steepness reducing means for reducing the slope steepness of said data pulses passing said first enable-dependent delay circuit, the second enable-dependent delay circuit comprising a second slope steepness reducing means for reducing the slope steepness of said data pulses passing said second enable-dependent delay circuit, resulting in a predetermined width of each slope;

wherein said output of each enable-dependent delay circuit is coupled to said enable control input of the respective other enable-dependent delay circuit;

and wherein the delay times of each of the enable-dependent delay circuits are at least as long as the width of the steepness-reduced slopes in terms of time.

* * * * *